United States Patent
Pozdeev

(10) Patent No.: US 6,864,743 B2
(45) Date of Patent: Mar. 8, 2005

(54) MICROWAVE AMPLIFIER WITH BYPASS SEGMENT

(75) Inventor: Oleg Pozdeev, Åkersberga (SE)

(73) Assignee: Allgon AB, Taby (SE)

(*) Notice: Subject to any disclaimer, the term of this patent is extended or adjusted under 35 U.S.C. 154(b) by 0 days.

(21) Appl. No.: 10/432,618

(22) PCT Filed: Nov. 9, 2001

(86) PCT No.: PCT/SE01/02490

§ 371 (c)(1),
(2), (4) Date: Jun. 5, 2003

(87) PCT Pub. No.: WO02/052722

PCT Pub. Date: Jul. 4, 2002

(65) Prior Publication Data

US 2004/0056710 A1 Mar. 25, 2004

(30) Foreign Application Priority Data

Dec. 22, 2000 (SE) ............................................. 00048348

(51) Int. Cl.[7] .............................................. H03F 3/68
(52) U.S. Cl. ............................... 330/124 D; 330/124 R
(58) Field of Search .................. 330/124 D, 124 R, 330/295, 51

(56) References Cited

U.S. PATENT DOCUMENTS

| | | | |
|---|---|---|---|
| 3,992,669 A | 11/1976 | Dades | 325/2 |
| 4,056,785 A | 11/1977 | Swan | 330/53 |
| 4,825,177 A | 4/1989 | Teague et al. | 330/295 |
| 5,418,490 A | 5/1995 | Kaegebein | 330/124 |
| 5,821,811 A | 10/1998 | Persson | 330/51 |
| 6,060,949 A | * 5/2000 | Kaufman et al. | 330/51 |
| 6,069,526 A | * 5/2000 | Ballantyne | 330/51 |
| 6,362,685 B1 | * 3/2002 | Vagher | 330/124 R |

* cited by examiner

Primary Examiner—Henry Choe
(74) Attorney, Agent, or Firm—Jacobson Holman PLLC

(57) ABSTRACT

A microwave amplifier device with a bypass segment, the device operating either in active mode or in bypass mode. The bypass segment (2) comprises at least one section (13) of coupled transmission lines (14,15) whereby the isolation is increased. The amplifier unit (1) includes two LNAs arranged in parallel in a balanced configuration, and the bypass segment (2) has a relatively high input impedance in active mode, whereby a balanced operation of the amplifier unit is maintained. Consequently, a low noise factor is obtained, as well as reduced input and output reflections.

11 Claims, 1 Drawing Sheet

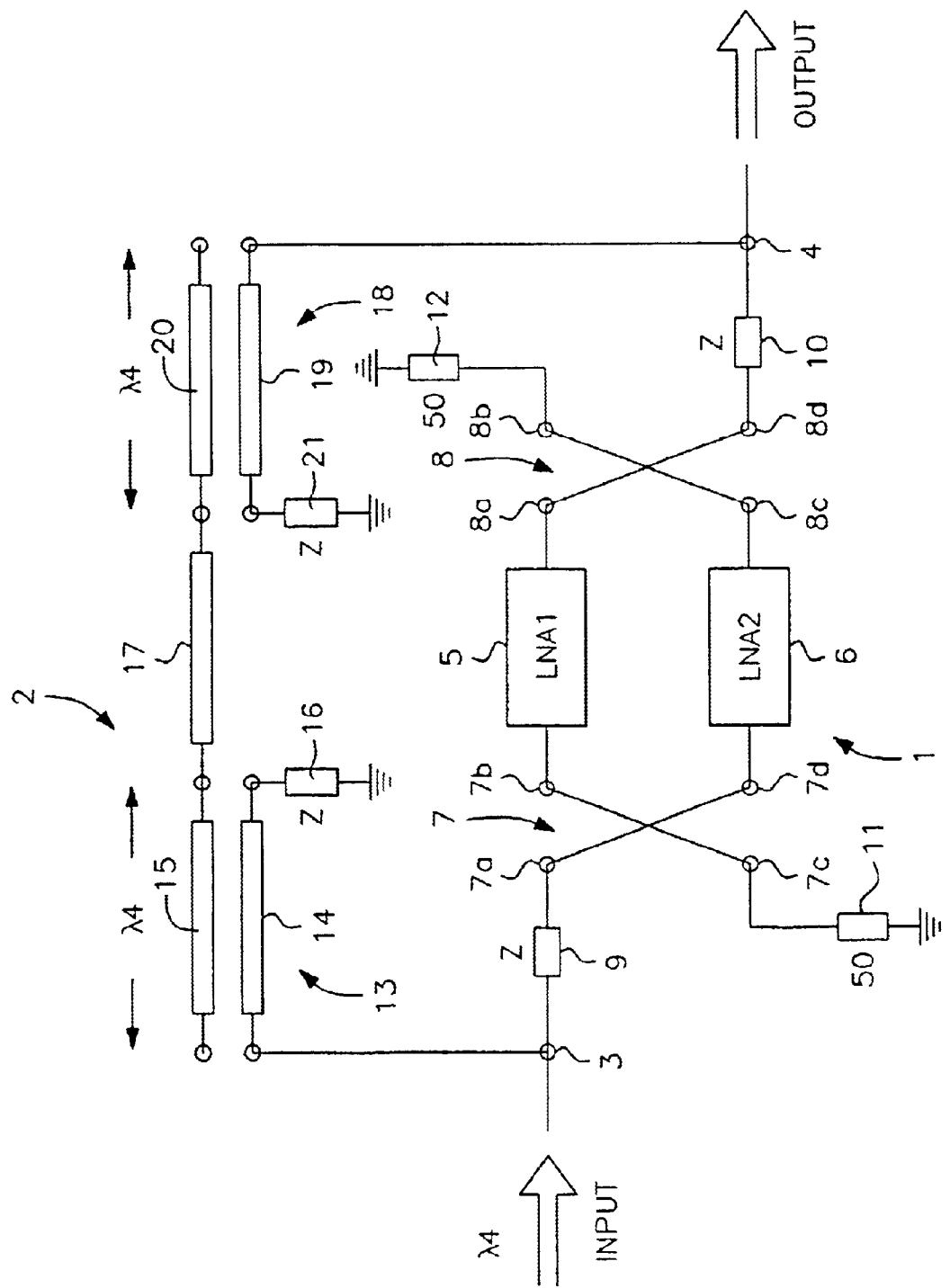

MICROWAVE AMPLIFIER WITH BYPASS SEGMENT

This is a nationalization of PCT/SE01/02490 filed Nov. 9, 2001 and published in English.

FIELD OF THE INVENTION

The present invention relates to a device for amplifying communication signals in a predetermined microwave frequency band above 500 MHz. A bypass segment is automatically activated when the amplifier unit becomes inoperative, e.g. due to failure of some RF component or DC failure, and is effectively blocked during normal operation of the amplifier unit. More particularly, the device is of the kind defined in the preamble of appended claim 1.

BACKGROUND OF THE INVENTION AND RELATED ART

A device of the aforementioned kind is disclosed in U.S. Pat. No. 5,821,811 (Allgon AB). In the known device, the amplifier unit forms a closed loop together with the bypass segment. In case the isolation across the bypass segment in active mode is lower than the amplifier gain, there is a risk of instability due to feedback through the bypass segment.

In order to secure sufficient stability, the isolation in the bypass segment should be at least 10 dB higher than the gain of the amplifier unit in active mode. When using the previously known device, which is provided with pin diodes as switching elements, it is necessary to use more than two switching elements, normally four switching elements to achieve an isolation of 30 dB. However, such an arrangement also leads to a relatively high insertion loss in the bypass mode of the device, namely in the order of 2 dB. This level is a drawback, since it adversely effects the operation of the device in the bypass mode.

A related problem of an amplifier/bypass device of the aforementioned kind is the difficulty in ensuring a proper operation of the device in active mode. Thus, it is desired to maintain a low noise factor and to avoid input/output reflections in the amplifier unit.

Such noise will appear even if two identical low noise amplifiers (LNA) are inserted in a balanced configuration between an input hybrid coupler and an output hybrid coupler, as is previously known per se from U.S. Pat. No. 4,825,177 (General Instrument Corporation). This is due to the fact that the bypass segment will alter the balance of the amplifier unit.

SUMMARY OF THE INVENTION

Accordingly, a general object of the present invention is to provide an improved device of the aforementioned kind, which operates properly in the active mode as well as in the bypass mode.

More specifically, a first object of the invention is to increase the bypass isolation in the active mode and to reduce the insertion loss in the bypass segment in the bypass mode.

A second specific object of the invention is to reduce the noise factor and to reduce input/output reflections in the amplifier unit, when operating in active mode.

The above mentioned first object is achieved for a device having the features stated in claim 1. Thus, the bypass segment of the device according to a first aspect of the invention comprises at least one section of coupled transmission lines, whereby the isolation against feedback through the bypass segment is improved.

By this measure, it is sufficient to include only two switching elements and still obtain a drastically improved isolation of about 55 dB (when using in diodes as in the prior art device) in the active mode and a bypass insertion loss of only 1 dB in the bypass mode.

According to a second aspect of the invention, the above-mentioned second object is attained for a device having the features stated in claim 6.

Preferably, the input impedance of the bypass segment, in said active mode of the device, is at least an order of magnitude higher than the input impedance of the amplifier unit (typically 50 ohm). In this way, the two low noise amplifiers, arranged in a balanced configuration to form the amplifier unit, are balanced through a wide frequency band, even for frequencies above the predetermined microwave frequency band. Advantageously, such a relatively high input impedance of the bypass segment (in active mode) is combined with the above-mentioned section of mutually coupled transmission lines. Accordingly, it is hereby possible to achieve an increased isolation and stability, a low noise factor and a reduction of the input/output reflections in the amplifier unit when operating in active mode, as well as a reduced insertion loss in the bypass segment when operating in bypass mode.

These and other features will be apparent from the detailed description below.

BRIEF DESCRIPTION OF THE DRAWING

The invention will be explained more fully below with reference to the appended drawing which illustrates a preferred embodiment of the device according to the invention.

The single drawing FIGURE illustrates schematically an amplifier device with a bypass segment in accordance with the present invention (on a printed circuit board which is not shown on the drawing).

DESCRIPTION OF A PREFERRED EMBODIMENT

The circuitry shown on the drawing comprises an amplifier unit 1 with a bypass segment 2 for use, e.g., in combination with an antenna, duplex means, and band-pass filters at the top of an antenna mast or tower in a cellular mobile telephone system, as explained in the above-mentioned U.S. Pat. No. 5,821,811.

The amplifier unit 1 has the task of amplifying received communication signals, in a predetermined microwave frequency band in a frequency range above 500 MHz, before these signals become significantly attenuated along a transmission line (not shown) to a base station located adjacent to the bottom of the antenna mast or tower.

The amplifier unit 1 is inserted between an input port 3 and an output port 4, the bypass segment 2 being arranged in parallel to the amplifier unit 1, likewise between the input and output ports 3,4.

As previously known per se (see the above-mentioned U.S. Pat. No. 4,825,177), the amplifier unit comprises two low noise amplifiers (LNA) 5,6 arranged in parallel between an input hybrid coupler 7 and an output hybrid coupler 8. An input hybrid port 7a is connected to the input port 3 via a switching element 9, whereas an output hybrid port 8d is connected to the output port 4 via a switching element 10. An isolated port 7c of the input hybrid coupler 7 is connected to ground via a 50 ohm impedance element 11, and the other output port 8b is likewise connected to ground via a 50 ohm impedance element 12.

So, the two amplifiers 5,6 are single-ended and are coupled between the input and output ports 3,4 in a fully balanced configuration. In the normal operation of the device, during which the four switching elements 9,10,16,21 are controlled to a very low impedance value, the input signal appearing on the input hybrid port 7a is coupled in equal proportions to the hybrid output ports 7b,7d, whereas the output signals from the amplifiers 5,6 are coupled from the hybrid ports 8a,8c to the hybrid output port 8d and the output port 4 via the switching element 10. Preferably, the hybrid couplers 7 and 8 are constituted by Lange couplers or modified Lange couplers, e.g. of the kind described in the Swedish patent application concerning a "4-port hybrid coupler" filed by same applicant, Allgon AB, on the same day as the present patent application. However, it is also possible to use any other 3 dB 90 degrees hybrid coupler.

Thanks to the balanced configuration of the two low noise amplifiers 5,6, the amplifier unit 1 is operative in a relative broad frequency band with a substantially constant gain.

According to the present invention, the bypass segment 2 is designed so as to increase the stability of the device and also to secure a substantially balanced operation of the amplifier unit in spite of the bypass segment.

In order to achieve a good stability and to avoid a possible feed-back through the bypass segment 2, the latter is provided with two sections of coupled transmission lines, a first section 13 including a first transmission line 14 and a second transmission line 15. The first transmission line 14 is connected between the input port 3 of the device and a switching element 16, the impedance of which is automatically and/or remotely controllable, e.g. by a control circuit (not shown) located in the amplifier/bypass device or at an associated base station.

As disclosed in the above-mentioned U.S. Pat. No. 5,821,811, such a controllable switching element may be constituted by a diode, a bipolar transistor, a field effect transistor or an electromechanical relay. In any case, the switching element 16 is switched between a very high impedance, such as 5 kohm, and a relatively low impedance, such as 1–10 ohm.

When the switching elements 9,10,16,21 are controlled to a state of very high impedance, which is the case when the amplifier unit is inoperable for one reason or another (bypass mode), e.g. due to a failure of a RF component or a failure of the DC current driving the unit, the transmission line 14 will be electrically open ended (its length being ¼ of the wavelength possibly added with a number N of half wavelengths, N=0,1,2, . . . ) and will therefore couple strongly to the adjacent, parallel transmission line 15. The wavelength refers to a frequency within the microwave frequency band being used, e.g. a central frequency in such a band.

A communication signal applied to the input port 3 will therefore propagate via the first section 13 of coupled transmission lines 14,15, via a third, centrally located bypass segment section 17, and via a second section 18 of coupled transmission lines 19,20. The latter section 18 is identical to the first section 13 and the transmission line 19 is connected between the output port 4 of the device and a remotely controllable switching element 21 similar or identical to the element 16. The four switching elements 9,10,16,21 are controlled in synchronism so as to be either in a high impedance state or in a low impedance state at the same time.

However, when the amplifier unit 1 operates normally (active mode), the four switching elements 9,10,16,21 are controlled to a state of relatively low impedance, whereby the bypass segment is cut off. An input signal on the input port 3 will then propagate through the amplifiers 5,6 to the output port 4. In the illustrated embodiment, the isolation across the bypass segment 2 is very high, approximately 55 dB, and there is no risk of feedback.

On the other hand, in the bypass mode the insertion loss in the bypass segment 2 is very low, approximately 1 dB.

Furthermore, in active mode, thanks to the low impedance of the associated switching elements 16 and 21 in the bypass segment, the bypass input impedance in this active mode is relatively high, whereby the balanced operation of the two low noise amplifiers 5,6 is maintained. Irrespective of the state of the hybrid couplers 7,8, such a balanced operation will be retained since the effective input and output loads of the amplifiers 5,6 are unaffected by the bypass segment. Consequently, the noise factor is very low, and the input and output reflections are likewise low.

What is claimed is:

1. A device for amplifying communication signals in a predetermined microwave frequency band above 500 MHz, comprising a printed circuit board, PCB, with transmission line segments arranged between an input port and an output port, an amplifier unit with at least one low noise amplifier, LNA, a bypass segment extending in parallel to said amplifier unit, and switching elements for activating said bypass segment in a bypass mode of the device, in case said amplifier unit becomes inoperable, and for effectively blocking the bypass segment in an active mode of the device, said bypass segment comprising a series of at least two segment sections having at least one junction point connected to an associated one of said switching elements, characterized in that said bypass segment comprises at least one section of coupled transmission lines disposed adjacent to each other so as to provide a strong electromagnetic coupling therebetween, whereby the isolation against feedback through the bypass segment is improved.

2. The device defined in claim 1, wherein said bypass segment comprises two bypass segment sections each comprising a section of coupled transmission lines, a first transmission line in a first section being inserted between said input port of the device and an associated switching element, and a second transmission line in said first section being connected to another one of said series of bypass segment sections, a first transmission line in a second section being inserted between said output port of the device and an associated switching element, and a second transmission line in said second section being connected to another one of said series of bypass segment sections.

3. The device defined in claim 2, wherein said second transmission lines in said first and second segment sections are conductively connected to each other.

4. The device defined in claim 3, wherein said second transmission lines are connected to each other via a third bypass segment section.

5. The device defined in claim 1 wherein each of said transmission lines has a length of substantially a quarter wavelength.

6. The device defined in claim 1, wherein the impedance of said switching elements is remotely controllable.

7. A device for amplifying communication signals in a predetermined microwave frequency band above 500 MHz, comprising a printed circuit board, PCB, with transmission line segments arranged between an input port and an output port, an amplifier unit with at least one low noise amplifier, LNA, a bypass segment extending in parallel to said amplifier unit, and switching elements for activating said bypass segment in a bypass mode of the device, in case said amplifier unit becomes inoperable, and for effectively blocking the bypass segment in an active mode of the device, said bypass segment comprising a series of at least two segment sections having at least one junction point connected to an associated one of said switching elements, characterized in that said amplifier unit comprises a pair of identical low noise amplifiers LNAs arranged in parallel in a symmetrical, balanced configuration, including an input hybrid coupler connected to said input port and an output hybrid coupler connected to said output port, and said bypass segment has an input impedance in said active mode of the device, which is substantially higher than the input impedance of the device, at said input port, whereby a balanced operation of said amplifier unit is maintained in said active mode.

8. The device defined in claim 7, provided with a bypass segment comprising at least one section of coupled transmission lines, whereby the isolation against feedback through the bypass segment is improved.

9. The device defined in claim 7, wherein said input and output hybrid couplers are connected to said input and output ports via associated switching elements.

10. The device defined in claim 7, said two LNAs are single-ended.

11. The device defined in claim 7, wherein the input impedance of the bypass segment is at least an order of magnitude higher than the input impedance of said amplifier unit.

* * * * *